United States Patent [19]

Subramanian

[11] 3,959,748
[45] May 25, 1976

[54] DUAL SIDESTEPPING SWIF AND METHOD
[75] Inventor: Sundaram Subramanian, Evanston, Ill.
[73] Assignee: Zenith Radio Corporation, Chicago, Ill.
[22] Filed: Dec. 26, 1973
[21] Appl. No.: 428,584

[52] U.S. Cl.................................. 333/72; 29/25.35; 310/9.8
[51] Int. Cl.² ...................... H03H 9/26; H03H 9/30; H03H 9/32; H01L 41/22
[58] Field of Search................ 333/30 R, 72; 310/8, 310/8.1, 9.7, 9.8; 29/25.35

[56] References Cited
UNITED STATES PATENTS

| | | | |
|---|---|---|---|
| 3,559,115 | 1/1971 | DeVries | 333/72 |
| 3,621,482 | 11/1971 | Adler | 333/72 |
| 3,675,163 | 7/1972 | Hartmann et al. | 333/30 R |
| 3,766,496 | 10/1973 | Whitehouse | 333/72 X |
| 3,836,876 | 9/1974 | Marshall et al. | 333/30 R |

OTHER PUBLICATIONS

Marshall et al., Theory and Design of the Surface Acoustic Wave Multistrip Coupler", in IEEE Trans. on Sonics and Ultrasonics, vol. SU-20, No. 2, Apr. 1973, pp. 124–133.

Smith et al., "Analysis of Interdigital Surface Wave Transducers by the Use of an Equivalent Circuit Model", in IEEE Trans. on Microwave Theory and Techniques, vol. MTT-17, No. 11, Nov. 1969, pp. 856–861.

Primary Examiner—Alfred E. Smith
Assistant Examiner—Marvin Nussbaum
Attorney, Agent, or Firm—Nicholas A. Camasto; Roy A. Ekstrand

[57] ABSTRACT

A method of manufacturing an acoustic surface wave filter includes forming a first and second pair of transducers and a multistrip coupler upon the surface of a piezoelectric medium in a rectangular configuration with the transducers occupying its corners. Each transmitting transducer is diagonally oriented with its respective receiving transducer and the multistrip coupler is interposed between the transmitting and receiving transducers substantially orthogonal to the direction of surface wave propagation. Test signals are applied to each transducer pair to select the most favorable for use. The other pair is disabled. A SWIF manufactured in accordance with the method is disclosed having one pair of transducers disabled.

14 Claims, 3 Drawing Figures

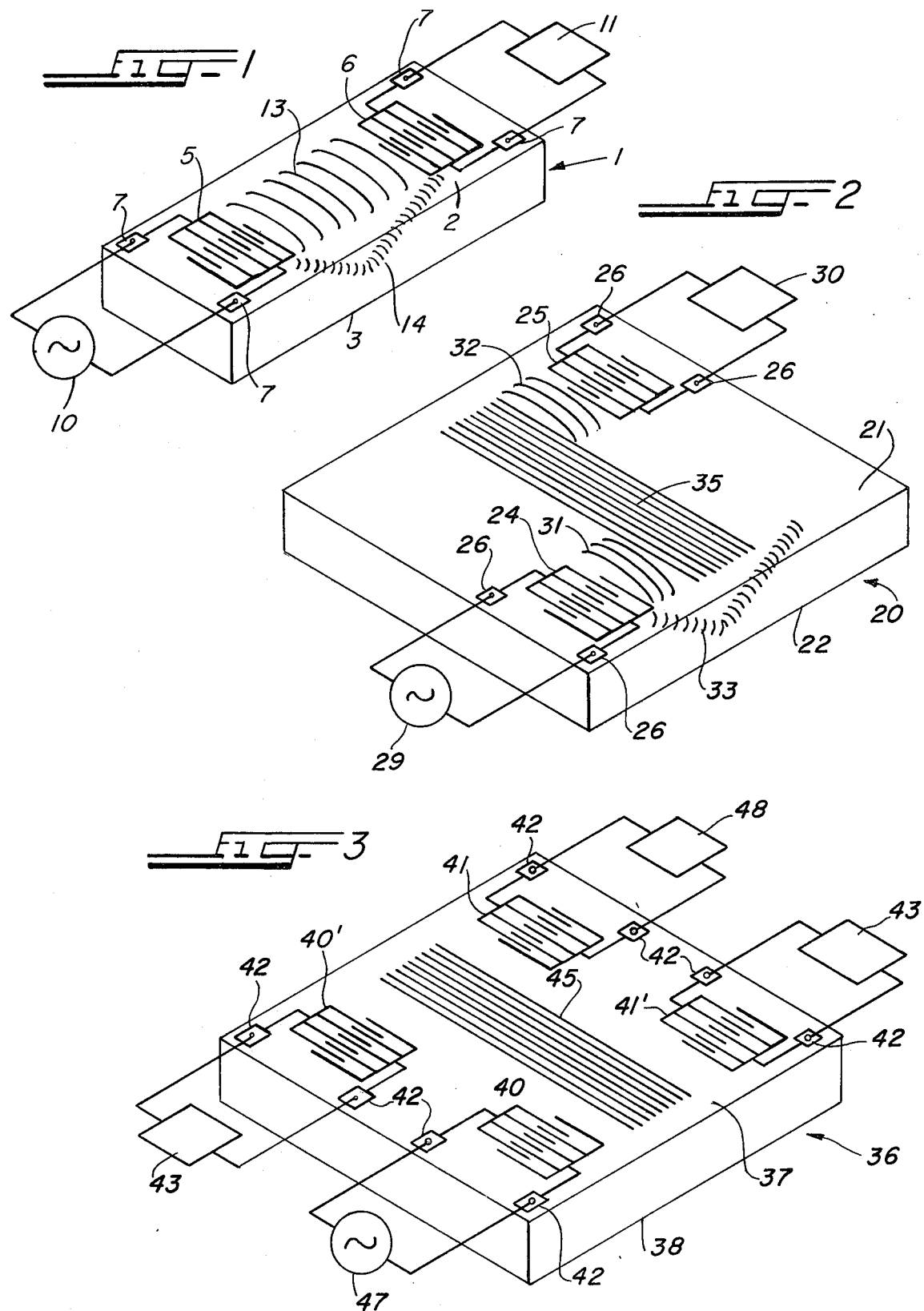

DUAL SIDESTEPPING SWIF AND METHOD

BACKGROUND OF THE INVENTION

Surface wave integratable filters (SWIF's) comprise a pair of transducers each generally composed of a pair of separated interleaved comb-shaped electrodes of conductive elements (teeth) coupled to the surface of a piezoelectric medium for producing and receiving acoustic surface waves. Means are provided for impressing an electrical signal across one of the pair of electrodes, referred to as the input transducer, and for recovering signals intercepted by the other of the pair of electrodes, referred to as the output transducer. In a simplified embodiment a piezoelectric ceramic wafer is polarized perpendicularly to the propagating surface and the waves travel at right angles to the electrode elements. In crystalline materials, the waves may travel at an acute angle to the elements, the particular angle in a given case being a function of the crystallography of the material.

The surface waves launched by the transmitting, or input transducer, propagate across the medium and are converted back into an electrical signal by the receiving or output transducer. In principle, the pattern of teeth in the interleaved comb-shaped electrodes is analogous to that of an antenna array. Consequently, exceptional frequency selectivity is possible without large, critical components normally associated with frequency selective circuits. Thus, this device, with its small size, may be of particular use in solid-state integrated circuits requiring a high degree of signal selectivity.

Since the input and output transducers are separated, the acoustic wave requires a finite time to travel from one to the other. At the output transducer, a portion of the acoustic wave energy is converted to electrical energy and delivered to a connected load, a portion continues on past the output transducer, and a portion is relfected back toward the input transducer. This reflected surface wave, which is identical in frequency to the transmitted surface wave, but smaller in magnitude, intercepts the input transducer where it too is reflected back toward the output transducer, resulting in a diminished replica of the original surface wave signal at the output transducer. Unfortunately, the diminshed replica arrives later than the transmitted signal (the time delay being equal to twice the transit time from input to output) and gives rise to objectionable interference.

While SWIF devices are designed to function by the propagation of surface waves, in the transduction process the launching transducer creates bulk waves which travel through the body of the medium. These bulk waves, upon reaching a surface of the medium, most noticeably the surface opposite the transducer bearing surface, are reflected and induce voltages in the receiving transducer.

If, for example, the SWIF is used as the signal-selective device in a television intermediate-frequency amplifier, the reflected IF waves result in "ghosts" or multiple images in the reproduced image making it highly undesirable if not completely unacceptable for normal viewing.

Known methods of overcoming the problem of reflected surface waves include selecting the output load impedance to maximize energy transfer thereto, depositing surface wave attenuating material between the transducers (which attenuates the reflected wave three times whereas the transmitted wave is attenuated only once), and reducing the time delay by placing the output transducer closer to the input transducer.

The adverse effects of bulk waves are effectively minimized in the well-known sidestepping SWIF configuration. Briefly, such devices use a surface wave coupler between transmitting and receiving transducers to guide surface waves in an S-shaped path which the bulk waves of major concern cannot follow. Sidestepping SWIF's, however, require almost twice the surface area as conventional SWIF's, which adds to their cost.

The processes and techniques used to manufacture SWIF's are complex and intricate and a summary at this point may be helpful. A seed of lithium niobate is used to grow an elongate crystal, called a boule, which is then poled by application of electrodes bearing a suitable DC potential. Poling results in imparting piezoelectric properties to the boule. Current practice is to cut the boule into thin wafers such that the Z axis is used for surface wave propagation. One side of each wafer is then ground and polished to a mirror-like finish and thoroughly cleaned.

The polished surface of the wafer, now approximately 2 inches in diameter, is covered with a layer of aluminum or gold approximately 4000A thick by the familiar vacuum deposition process of exposing the wafer to a heated element containing the depositing metal in an evacuated environment. A coating of photoresistive material such as Shipley AZ1350H is uniformly applied to the metal surface and the wafer baked at approximately 75° C for a period sufficient to dry the resist material. The wafer is then exposed by either projection printing or contact printing photolithograhic techniques, using a source of ultraviolet light, to form a latent image of the desired metallization pattern in the resist material. After developing, an etching agent, in this case a mixture of phosphoric acid, acetic acid and nitric acid, is then used to remove the undesired metal film leaving behind the metallized pattern forming transducers and suitable connection pads. SWIF devices are quite small, typically 140 × 460 mils and, therefore, a single 2 inch diameter wafer is generally simultaneously imprinted with 30 to 40 individual SWIF device patterns, which are later separated by either laser cutting or sawing the wafer. The devices, once separated, are placed within a suitable housing, mounted and connected to leads as, for example, described in application Ser. No. 366,811 filed June 4, 1973 in the name of Guy N. Falco entitled "CERAMIC PACKAGE AND METHOD FOR A SURFACE WAVE SELECTIVE DEVICE", and now U.S. Pat. No. 3,872,331, and assigned to the assignee of the present application.

Techniques of manufacturing and testing vary between manufacturers, some preferring to test the individual devices on the wafer, using conventional solid-state manufacturing techniques while others test after final assembly.

SWIF manufacture in general, whether of the conventional or sidestepping type, is costly and the percentage yield of acceptable units is low. One cause of this low yield is found in transducer construction defects which are only detectable during the late stages of manufacture, that is, after the medium has been prepared and transducers have been formed. Consequently, such defects are found only after these expensive operations have been performed.

Accordingly, it is an object of the present invention to provide a novel method of manufacturing sidestepping SWIF devices.

Another object of this invention is improving the manufacturing yield of sidestepping SWIF's.

It is another object of the present invention to provide a novel sidestepping SWIF device.

Summary of the Invention

A method of manufacturing sidestepping acoustic surface wave filters, in which surface waves created in a piezoelectric medium by a transmitting transducer are guided to an offset receiving transducer by an interposed multistrip coupler, uses the vacant areas on the piezoelectric medium, resulting from the offset, to increase the percentage yield of such manufacture by forming a first and a second pair of transducers and a multistrip coupler upon the surface of the medium, such that the second transducer pair occupies areas normally left vacant by the sidestepping transducer configuration, and determining which of the transducer pairs is most favorable.

BRIEF DESCRIPTION OF THE DRAWINGS

The features of this invention which are believed to be novel are set forth with particularity in the appended claims. The invention, together with its further objects and advantages, may best be understood by reference to the following description taken in conjunction with the accompanying drawings in the several figures of which like reference numerals refer to like elements and in which:

FIG. 1 is a perspective view of a conventional SWIF device coupled to a source of electric signals and a load impedance;

FIG. 2 is a perspective view of a sidestepping SWIF device also coupled to a source of electric signals and a load impedance; and FIG. 3 is a perspective view of a sidestepping SWIF device, constructed in accordance with the disclosed invention, having one transducer pair coupled to an electric signal source and load and the other to disabling means.

DETAILED DESCRIPTION OF THE INVENTION

FIG. 1 shows a conventional surface wave integratable filter (SWIF) having an essentially planar piezoelectric medium 1 defining a propagating surface 2 upon which a transmitting transducer 5 and a receiving transducer 6 are deposited. Transducer 5 is coupled to a source of AC signal potential 10 and transducer 6 coupled to a load impedance 11 via suitably located, deposited connecting pads 7. While any one of several transducer configurations may be used, transducers 5 and 6 are shown as interdigitated pairs of comb-like structures electrically isolated from each other and connected to the appropriate source or load as shown.

In operation, an AC potential is applied to the interdigitated combs of transducer 5 producing an electric field between elements which stresses the piezoelectric material of medium 1. The stresses produced in the piezoelectric material are alternately increased and decreased by the alternating signal generated by source 10. These alterations in stress cause successive waves to be created in the medium which propagate from transducer 5, forming travelling acoustic surface waves 13. As shown, a portion of surface waves 13 travel across surface 2 and are incident upon receiving transducer 6. At transducer 6, which is similar in structure to transducer 5, the alternate peaks and troughs of the surface waves are converted from acoustic energy to electrical energy and a resulting alternating voltage appears across coupled load 11.

In addition to the desired surface waves 13, undesired but generally unavoidable bulk waves 14 are also produced by transducer 5. Bulk waves 14 travelling through medium 1 strike the bottom surface 3 of the medium, are reflected back toward surface 2, and encounter transducer 6. In a similar manner to that described for surface waves, bulk waves also produce a time varying voltage at transducer 6. As can be seen in FIG. 1, the paths of surface waves 13 and bulk waves 14 are of different lengths and hence the transit times of bulk waves and surface waves differ.

FIG. 2 shows a conventional sidestepping SWIF filter which provides a practical solution to problems associated with bulk wave propagation. A piezoelectric medium 20 has a pair of transducers 24 and 25 deposited upon its surface 21. As discussed above, an AC voltage source 29 is coupled to the transmitting transducer 24 and a load impedance 30 is coupled to a receiving transducer 25. Transducers 24 and 25, however, are not "in line" as in FIG. 1 but are offset, hence the name sidestepping SWIF. A multistrip coupler 35, comprising a plurality of equally spaced metallic strips interposed between transducers 24 and 25, is deposited on surface 21. Surface waves 31 launched by transducer 24 propagate in the direction shown and encounter multistrip coupler 35. Multistrip coupler 35 causes a second series of surface waves 32 to be generated and moved toward offsett receiving transducer 25. As a result, surface waves travel an S-shaped path from transducer 24 through coupler 35 to transducer 25 where they produce voltage variations across load 30.

In addition to surface waves 31, transducer 24 also produces bulk waves 33 which propagate into medium 20, strike surface 22, and are reflected back to surface 21. As can be seen, the sidestepping configuration serves to move the receiving transducer 25 out of the path of the reflected bulk waves, which are not guided by coupler 35.

The use of sidestepping SWIF filters provides an effective solution to the problems of bulk wave propagation. However, comparison of FIGS. 1 and 2 shows that the sidestepping SWIF requires nearly twice the surface area as that of a similar conventional SWIF. The advantages of bulk wave problem elimination, therefore, has the attendant disadvantages of increased surface area requirements and use of more piezoelectric material.

The piezoelectric material used is expensive, for example, a lithium niobate substrate typically costs $0.40 in very large quantities. Notwithstanding this high cost, repair or reclamation of defective devices is not usual and rejects result in loss of the devices as well as a reduction in yield. The yield percentage is a ratio of acceptable to unacceptable devices and is of critical importance in a successful manufacturing process. Improvements therein are of constant concern.

FIG. 3 shows a sidestepping SWIF filter embodying the present invention. A piezoelectric medium 36 has a propagating surface 37 upon which a multistrip coupler 45, a first pair of transducers 40, 41 and a second pair of transducers 40', 41' are deposited. Transducers 40 and 41, together with multistrip coupler 45, comprise a sidestepping SWIF similar to that discussed in FIG. 2 above. Transducers 40' and 41', together with multistrip coupler 45, also comprise a sidestepping SWIF. Since all four transducers, the multistrip coupler and the connecting pads are simultaneously formed in the same photolithographic process, the additional transducer pair does not significantly increase manufacturing cost.

As described earlier, it may be preferable to test the individual SWIF devices before cutting the wafer. In that event test signals applied by probing techniques currently used in semi-conductor manufacture could be used to determine which pair of transducers is most favorable and which is to be disabled. However, testing of the devices before cutting could concentrate on discovering defective metallization leaving more thorough testing of response characteristics to a later step.

The transducer pair may also be selected on the basis of accommodating variations in piezoelectric characteristics with the transducer pairs being designed to compensate therefor. For example, if the tolerance variations in the medium alone can result in a frequency deviation of 200 kHz at 45 MHz, one transducer pair may be designed to be 200 kHz different from the other pair and the best pair selected after testing.

Further, the selection of the transducer pair to be used can also compensate for rejects caused by local variations of piezoelectric properties. In any event, since either transducer pair is usable, the percentage yield is increased. Once a transducer pair has been selected, it is desirable to disable the remaining pair to prevent its causing undesired reflections and degradation of SWIF performance. Disabling means 43, shown connected to transducers 40' and 41', are intended to be illustrative of either acoustic dampening or electrical disabling. For acoustic dampening, a deposit of acoustically absorbent material such as black wax may be placed on the transducer or transducers to be disabled to absorb any surface waves incident thereon. Similarly, a dummy impedance connected across the transducer connection pads 42 would disable it and reduce its tendency to cause reflections. For optimum disablement, the impedance of the dummy load should be selected in accordance with application Ser. No. 307,887 filed Nov. 20, 1972 entitled SURFACE WAVE FILTER AND METHOD in the name of Sundaram Subramanian and assigned to the assignee of the present application, and now U.S. Pat. No. 3,839,687, which is hereby incorporated by reference and which discloses the relationships between transducer duty factor and load impedance resulting in minimization of reflected surface waves.

What has been disclosed is a novel sidestepping SWIF filter and method of manufacture therefor which uses the vacant, and heretofore wasted areas, on the piezoelectric medium, resulting from the sidestepping configuration, to achieve an increase in the percentage yield of SWIF manufacturing.

While a particular embodiment of the present invention has been shown and described, it will be obvious to those skilled in the art that various changes and modifications may be made without departing from the invention in its broader aspects. Accordingly, the aim in the appended claims is to cover all such changes and modifications that may fall within the true spirit and scope of the invention.

What is claimed is:

1. A method of manufacturing sidestepping acoustic surface wave filters in which surface waves created in a piezoelectric medium by a transmitting transducer are guided to an offset receiving transducer by an interposed multistrip coupler and in which said offset results in vacant areas upon said piezoelectric medium, comprising the steps of:
   forming a first and a second pair of transducers and a multistrip coupler upon a surface of said piezoelectric medium, such that said second transducer pair occupies areas of said piezoelectric medium left vacant by the sidestepping configuration of said first transducer pair; and
   choosing for future use the most favorable of said transducer pairs and disabling at least one transducer of said other pair.

2. The method of claim 1, wherein said forming step includes the step of:
   locating said transducer pairs and said multistrip coupler upon said surface in a substantially rectangular configuration in which said transducers define the corners, each receiving transducer being diagonally oriented with respect to its transmitting transducer, and said interposed multistrip coupler is substantially orthogonal to the direction of propagation of surface waves launched by said transmitting transducers.

3. The method of claim 2, wherein said locating step includes the steps of:
   depositing a substantially uniform film of metallic material upon said surface; and
   selectively removing portions of said film to define said substantially rectangular configuration of transducer pairs and multistrip coupler.

4. The method of claim 3, wherein said choosing step includes the steps of:
   testing said transducer pairs by temporarily applying test signals thereto, for selecting the most favorable thereof; and
   affixing permanent electrical terminals to each transducer of said selected pair.

5. The method of claim 3, wherein said choosing step includes the steps of:
   affixing permanent electrical terminals to each of said transducers;
   testing said transducers by applying electrical test signals to said contacts.

6. The method of claim 4, wherein said disabling step further includes the step of:
   disabling the other of said transducer pairs by applying an acoustic dampening material to at least one transducer of said other pair.

7. The method of claim 4, wherein said disabling step further includes the step of:
   disabling the other of said transducer pairs by adding electrically conductive material to at least one transducer of said other pair to render it inoperative.

8. The method of claim 5, wherein said disabling step further includes the step of:
   disabling the other of said transducer pairs by applying an acoustic dampening material to at least one transducer of said other pair.

9. The method of claim 5, wherein said disabling step further includes the step of:
   disabling the other of said transducer pairs by connecting a predetermined dummy load to at least one transducer of said other pair to render it inoperative.

10. The method of claim 2, wherein said forming step further includes the steps of:
   depositing a substantially uniform film of metallic material upon said surface; and
   selectively removing portions of said film to define said substantially rectangular configuration of transducer pairs and multistrip coupler, said first and second transducer pairs having slightly different configurations to compensate for anticipated variations in the properties of said medium.

11. The method of claim 10, wherein said transducer pairs have center frequencies displaced from the desired and wherein said determining step includes choosing the one of said transducer pairs which in combination with the medium produces frequency selectivity closest to that desired.

12. The method of claim 11, wherein said transducer pairs have center frequencies which straddle that desired.

13. A sidestepping acoustic surface wave filter in which surface waves created in a piezoelectric medium by a transmitting transducer are guided to an offset receiving transducer by an interposed multistrip coupler, said filter comprising:
   a piezoelectric medium having a planar surface;
   a first and second pair of transducers deposited upon said surface in a substantially rectangular configuration in which said transducers define the corners and each receiving transducer is diagonally oriented with respect to its respective transmitting transducer;
   a multistrip coupler, including a plurality of parallel spaced conductive elements, deposited upon said surface, interposed between said transmitting and receiving transducers substantially orthogonal to the propagation direction of surface waves launched by said transmitting transducers;
   means permitting coupling the transmitting and receiving transducers of a selected one of said transducer pairs to a source of electric signals and a load impedance, respectively; and
   means permanently disabling at least one of the transducers of the other of said transducer pairs to render it inoperative.

14. A sidestepping acoustic surface wave filter as in claim 13, wherein said first and second pair of transducers are of slightly different configuration to maximize different frequencies.

* * * * *